US012451342B2

(12) United States Patent
Laskin et al.

(10) Patent No.: US 12,451,342 B2
(45) Date of Patent: Oct. 21, 2025

(54) APPARATUSES AND METHODS FOR MERGING ION BEAMS

(71) Applicant: PURDUE RESEARCH FOUNDATION, Indiana, IL (US)

(72) Inventors: Julia Laskin, Indiana, IL (US); Hang Hu, Indiana, IL (US); Pei Su, Indiana, IL (US)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 519 days.

(21) Appl. No.: 17/596,723

(22) PCT Filed: Jun. 18, 2020

(86) PCT No.: PCT/US2020/038525

§ 371 (c)(1),
(2) Date: Dec. 16, 2021

(87) PCT Pub. No.: WO2020/257518

PCT Pub. Date: Dec. 24, 2020

(65) Prior Publication Data

US 2022/0319826 A1 Oct. 6, 2022

Related U.S. Application Data

(60) Provisional application No. 62/862,837, filed on Jun. 18, 2019.

(51) Int. Cl.
*H01J 49/06* (2006.01)
*H01J 37/10* (2006.01)

(52) U.S. Cl.
CPC ............ *H01J 49/067* (2013.01); *H01J 37/10* (2013.01); *H01J 49/065* (2013.01)

(58) Field of Classification Search
None
See application file for complete search history.

(56) References Cited

U.S. PATENT DOCUMENTS 7,372,042 B2 5/2008 Mordehai et al.
7,381,373 B2 6/2008 Blake et al.
(Continued)

FOREIGN PATENT DOCUMENTS

JP H07101640 B2 * 11/1995

OTHER PUBLICATIONS

Joe W Kwan; "High Current Ion Sources and Injectors for Induction Linacs in Heavy Ion Fusion", IEEE Transactions on Plasma Science, vol. 33, No. 6, Dec. 2005; 10 pages.
(Continued)

*Primary Examiner* — Andrew Smyth

(57) ABSTRACT

An ion beam lens and methods for combining ion beams are disclosed. Embodiments combine hyperthermal ion beams and can include layered three-dimensional electrodes with passageways through the electrodes, each electrode having a specified DC voltage and each passageway configured for passing an ion beam to an exit, the velocity vectors of the beams being primarily oriented along the lens' central axis upon exiting the passageways. Embodiments include nested electrode plates with curved ion beam passageways. In some embodiments each electrode plate has a charge different from the electrode plates adjacent to it, and in some embodiments every other electrode plate is charged with a first DC voltage and the remaining plates are charged with a second DC voltage different from the first DC voltage.

12 Claims, 9 Drawing Sheets

(56) References Cited

U.S. PATENT DOCUMENTS

| | | | | |
|---|---|---|---|---|
| 7,910,377 | B2 | 3/2011 | Cooks et al. | |
| 7,952,070 | B2 | 5/2011 | Senko et al. | |
| 8,399,828 | B2 | 3/2013 | Vestal | |
| 9,184,038 | B2 | 11/2015 | Cooks et al. | |
| 2003/0042411 | A1* | 3/2003 | Leung | H01J 37/08<br>250/251 |
| 2008/0135748 | A1* | 6/2008 | Daimon | H01J 37/244<br>250/311 |

OTHER PUBLICATIONS

Brett M. Marsh, et al; "Space charge compensation in air by counterion flow in 3D printed electrode structure", International Journal of Mass Spectrometry, 468; Available online Jun. 1, 2021; 7 pages.

* cited by examiner

APPARATUSES AND METHODS FOR MERGING ION BEAMS

This application is a National Stage of International Application No. PCT/US20/038525, filed Jun. 18, 2020, which claims the benefit of U.S. Provisional Application No. 62/862,837, filed Jun. 18, 2019, the entireties of which are hereby incorporated herein by reference. Any disclaimer that may have occurred during the prosecution of the above-referenced applications is hereby expressly rescinded.

FIELD

Embodiments of this disclosure are related generally to generating increased fluxes of molecular ions, and in particular embodiments are related to lenses for merging ion beams.

BACKGROUND

Mass spectrometry is an analytical technique for molecular analysis and can be used as a preparative tool for deposition of ionic species with well-defined compositions and charge states onto solid and liquid interfaces. For example, intact polyatomic ions can be mass-selected in a mass spectrometer and deposited onto a target surface with kinetic energy in the hyperthermal range (1-100 eV) or higher (100-10,000 eV). In the hyperthermal range, the relatively low kinetic energy of the ions can result in a gentle deposition of ions onto the target surface, which is referred to as ion soft landing. Current ion beam deposition techniques including ion implantation, ion beam sputter deposition, and ion beam assisted deposition typically use ion kinetic energies in the keV (kilo-electron volt) range. Ion soft landing techniques, however, use hyperthermal beams of mass-selected ions to deposit intact polyatomic ions onto surfaces. A need for generating high fluxes of hyperthermal ions for soft landing applications has been identified, and one of the stages in the process of generating high fluxes of ions may involve merging several ion beams. However, it was realized by the inventors of the present disclosure that problems still exist with merging multiple ion beams, including low energy ion beams such as those with hyperthermal energy ranges. Certain preferred features of the present disclosure address these and other needs and provide other important advantages.

SUMMARY

Despite improvements in the ability to merge ion beams, the inventors of the present disclosure have realized that difficulties still exist. For example, while high energy ion beams (such as those with kinetic energies in the MeV (mega-electron volt) range) are relatively easy to manipulate and focus, lower energy ion beams (such as those with kinetic energies in the hyperthermal range) are more difficult to manipulate and focus. As another example, various systems cannot be used for merging ion beams of the same polarity, especially those with kinetic energies below 1 MeV, such as with merging multiple hyperthermal ion beams of the same polarity to generate a high-flux single ion beam for applications in preparative and analytical mass spectrometry.

Although ion soft landing can be complementary to other techniques such as molecular beam epitaxy and electrospray deposition, the inventors have realized that ion soft landing can provide access to a much broader range of molecules and precise control over their composition, kinetic energy, and deposition pattern on a surface. However, ion fluxes obtained using existing ion soft landing instruments are substantially lower than neutral molecule fluxes used in molecular beam epitaxy and related approaches, which limits the range of applications utilizing ion soft landing as a preparative technique. The inventors of the present disclosure realized that growing demands from both the fundamental and applied research fields can be met by scaling up of the ion soft landing instrumentation to generate substantially higher fluxes of mass-selected ions.

The inventors of the present disclosure also realized that it is still difficult to further improve ion fluxes due to the space charge limitations of current devices and methods. However, they also realized that merging of multiple ion beams could be useful in generating high fluxes of polyatomic ions, which would benefit both ion soft landing and analytical mass spectrometry. However, merging multiple hyperthermal ion beams approaching the instrument axis from different directions is difficult in that the ion trajectories must be carefully controlled to ensure the Apparatuses and Methods for Merging Ion Beams formation of a well-collimated single ion beam directed along the instrument axis while minimizing ion loss due to defocusing. The multichannel ion lens described herein provides a solution to this challenge and can increase the flux of ion beams generated from an ion source.

Embodiments of the present disclosure provide improved ion beam merging apparatuses and methods, and particular embodiments provide multichannel lenses, including multichannel ellipsoidal lenses, for merging multiple hyperthermal ion beams.

This summary is provided to introduce a selection of the concepts that are described in further detail in the detailed description and drawings contained herein. This summary is not intended to identify any primary or essential features of the claimed subject matter. Some or all of the described features may be present in the corresponding independent or dependent claims, but should not be construed to be a limitation unless expressly recited in a particular claim. Each embodiment described herein does not necessarily address every object described herein, and each embodiment does not necessarily include each feature described. Other forms, embodiments, objects, advantages, benefits, features, and aspects of the present disclosure will become apparent to one of skill in the art from the detailed description and drawings contained herein. Moreover, the various apparatuses and methods described in this summary section, as well as elsewhere in this application, can be expressed as a large number of different combinations and subcombinations. All such useful, novel, and inventive combinations and subcombinations are contemplated herein, it being recognized that the explicit expression of each of these combinations is unnecessary.

BRIEF DESCRIPTION OF THE DRAWINGS

Some of the figures shown herein may include dimensions or may have been created from scaled drawings. However, such dimensions, or the relative scaling within a figure, are by way of example, and not to be construed as limiting.

DETAILED DESCRIPTION OF THE ILLUSTRATED EMBODIMENTS

Figure 1:
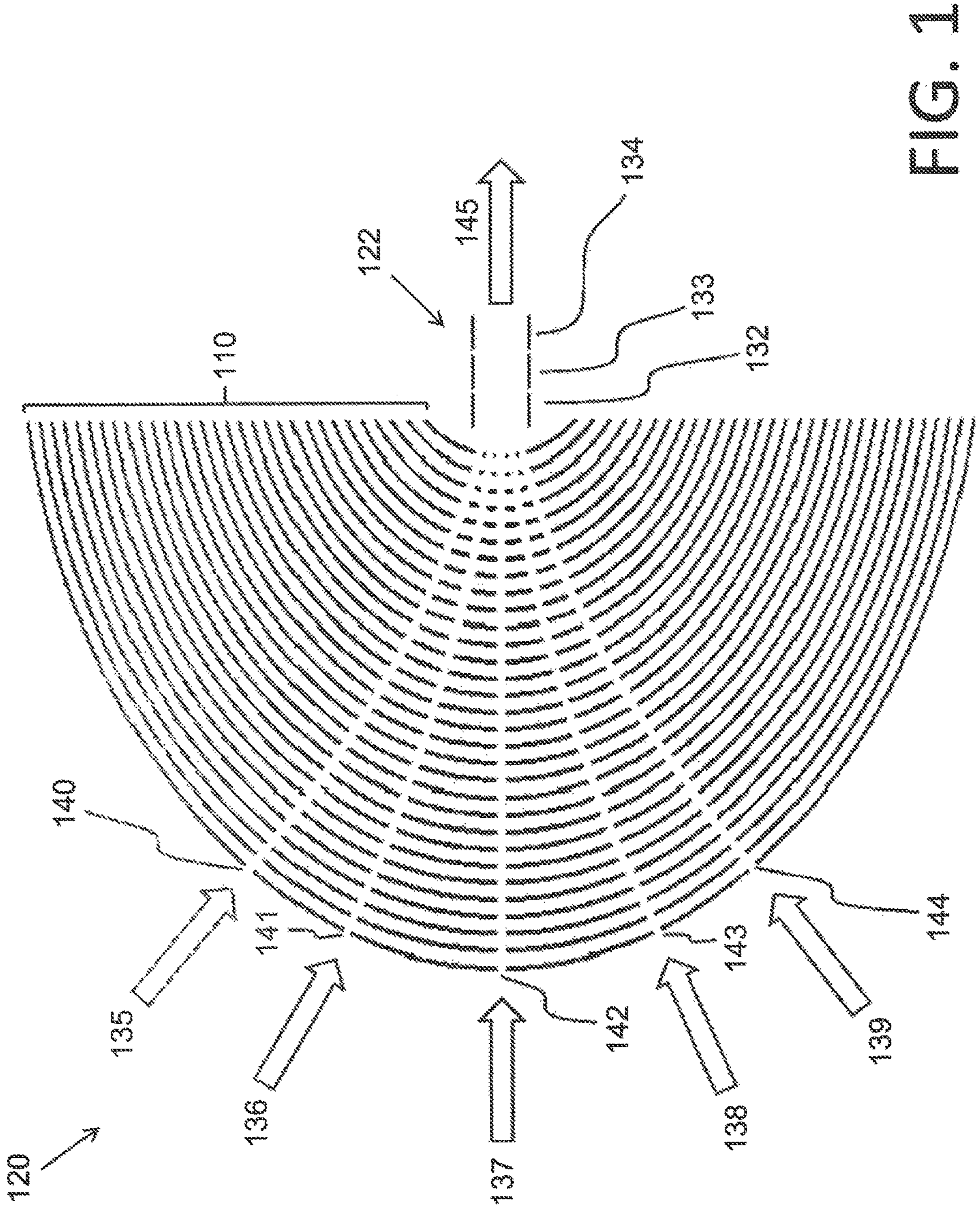
FIG. 1 is a sectional view of a multichannel ion beam lens according to one embodiment of the present disclosure.
Figure 2:
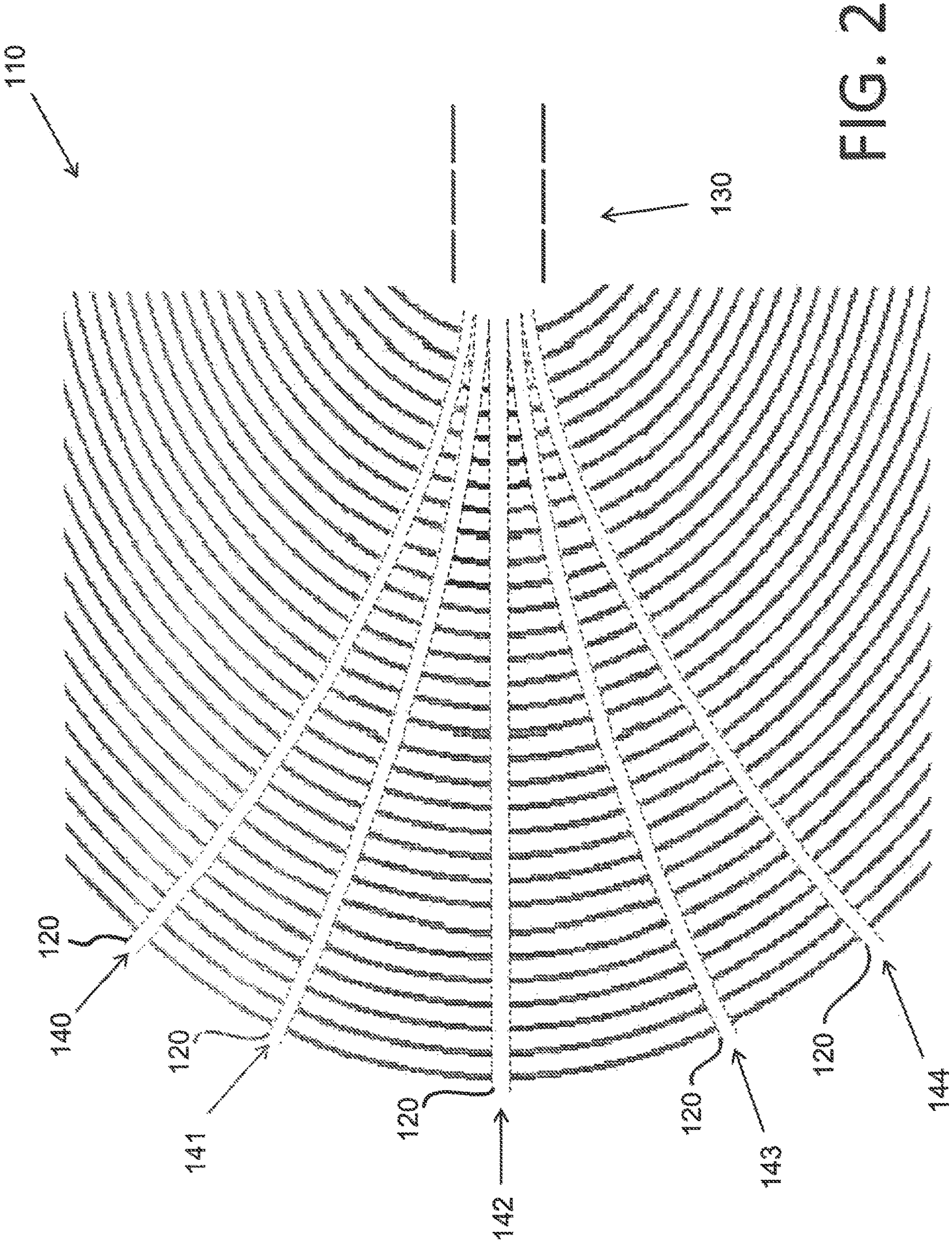
FIG. 2 is a partial view of the ion beam lens depicted in FIG. 1 depicting the boundaries of the ion beam passageways.
Figure 3:
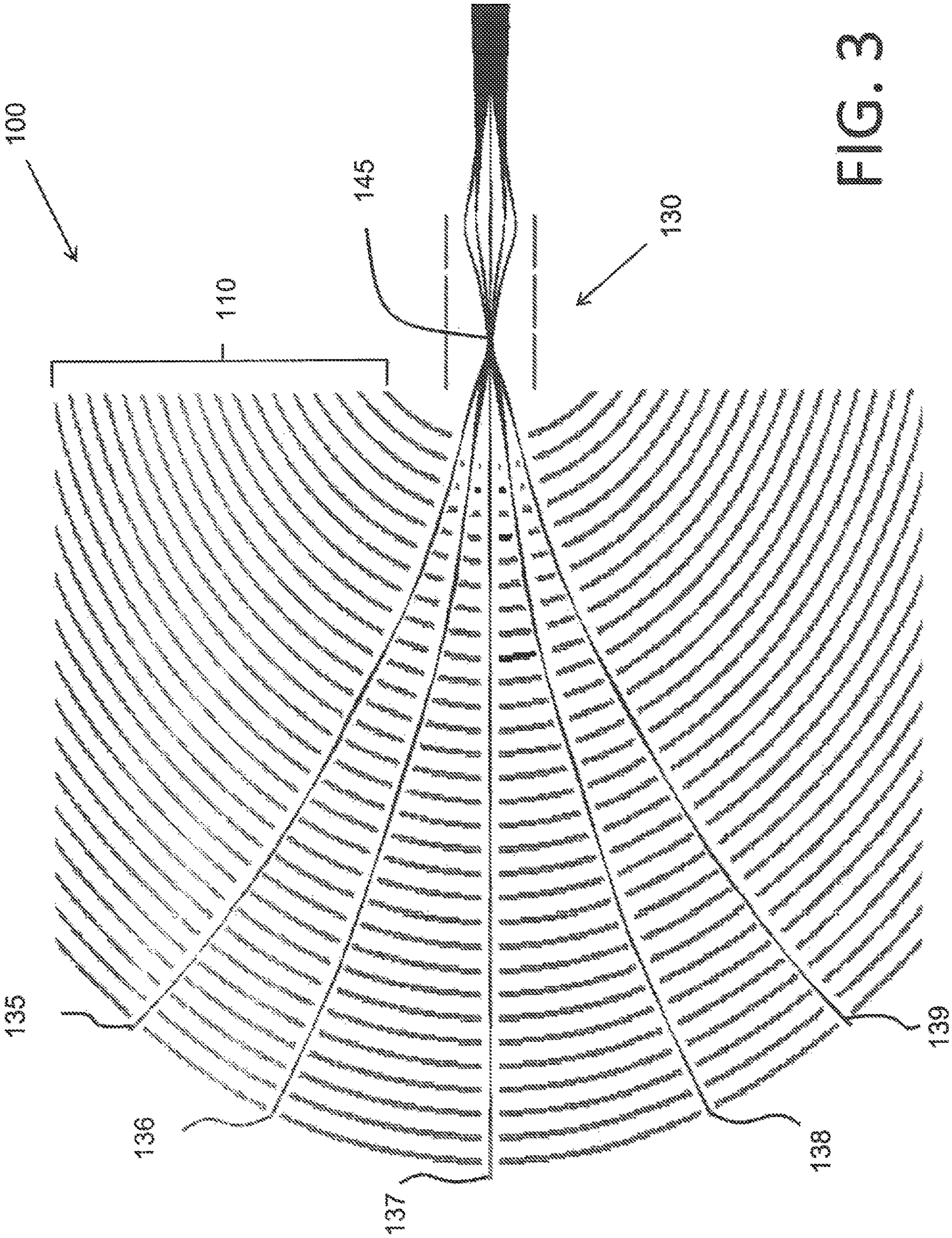
FIG. 3 is a partial view of the ion beam lens depicted in FIG. 1 depicting representative ion beams traveling through the ion beam passageways.

For the purposes of promoting an understanding of the principles of the disclosure, reference will now be made to one or more embodiments, which may or may not be illustrated in the drawings, and specific language will be used to describe the same. It will nevertheless be understood that no limitation of the scope of the disclosure is thereby intended; any alterations and further modifications of the described or illustrated embodiments, and any further applications of the principles of the disclosure as illustrated herein are contemplated as would normally occur to one skilled in the art to which the disclosure relates. At least one embodiment of the disclosure is shown in great detail, although it will be apparent to those skilled in the relevant art that some features or some combinations of features may not be shown for the sake of clarity.

Any reference to "invention" within this document is a reference to an embodiment of a family of inventions, with no single embodiment including features that are necessarily included in all embodiments, unless otherwise stated. Furthermore, although there may be references to benefits or advantages provided by some embodiments, other embodiments may not include those same benefits or advantages, or may include different benefits or advantages. Any benefits or advantages described herein are not to be construed as limiting to any of the claims.

Likewise, there may be discussion with regards to "objects" associated with some embodiments of the present invention, it is understood that yet other embodiments may not be associated with those same objects, or may include yet different objects. Any advantages, objects, or similar words used herein are not to be construed as limiting to any of the claims. The usage of words indicating preference, such as "preferably," refers to features and aspects that are present in at least one embodiment, but which are optional for some embodiments.

Specific quantities (spatial dimensions, temperatures, pressures, times, force, resistance, current, voltage, concentrations, wavelengths, frequencies, energy, heat transfer coefficients, dimensionless parameters, etc.) may be used explicitly or implicitly herein, such specific quantities are presented as examples only and are approximate values unless otherwise indicated. Discussions pertaining to specific compositions of matter, if present, are presented as examples only and do not limit the applicability of other compositions of matter, especially other compositions of matter with similar properties, unless otherwise indicated.

Figure 4:
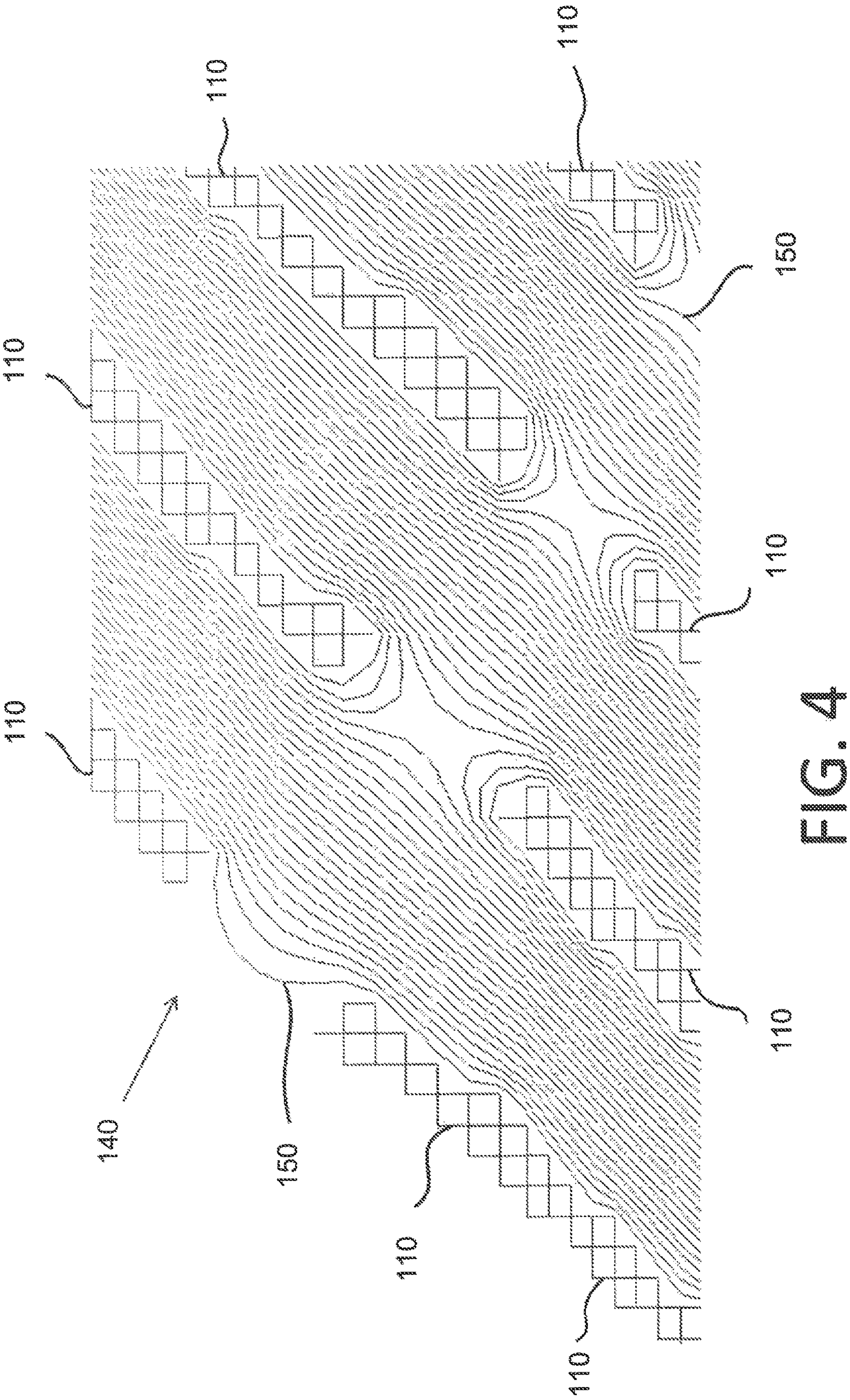
FIG. 4 is a partial view of the ion beam lens depicted in FIG. 1 depicting representative equipotential field lines that are present at the entrance to a passageway when the electrodes (approximated with square constituent components in the simulation) are charged with DC (direct current) power.
Figure 5:
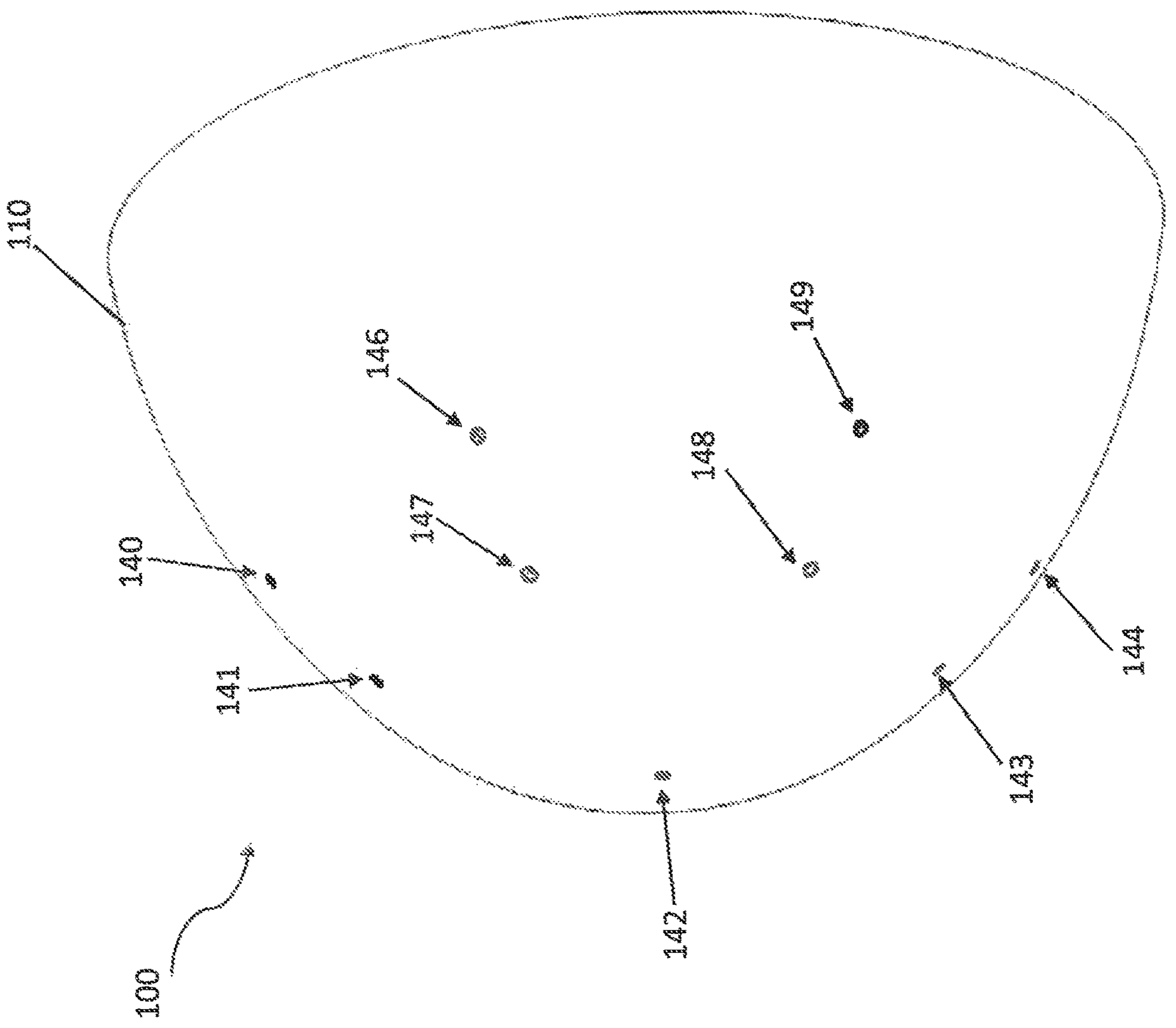
FIG. 5 is a perspective view of a front portion of the ion beam lens depicted FIG. 1.
Figure 6:
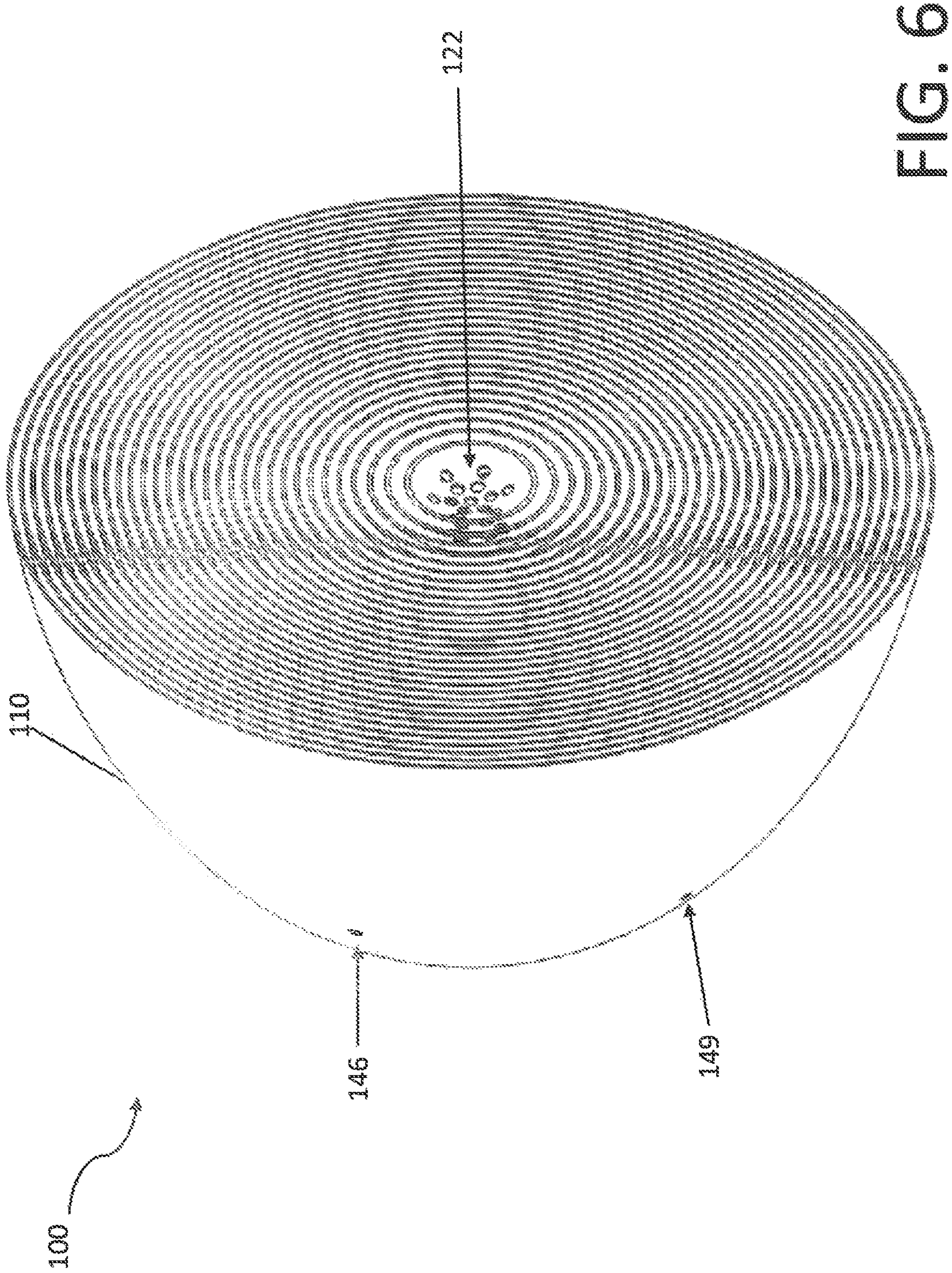
FIG. 6 is a perspective view of a rear portion of the ion beam lens depicted in FIG. 1.

Depicted in FIGS. 1-6 is a lens device 100 for merging multiple ion beams (for example multiple hyperthermal ion beams) according to one embodiment of the present disclosure. The device shown in FIGS. 1-6 includes a plurality of electrodes 110 and a plurality of passageways 120 through the electrodes 110, the passageways 120 being defined by apertures in the electrodes 110. The electrodes 110 are adjacent one another and form a three-dimensional (3-D) object similar to an onion. However, unlike an onion the adjacent electrodes 110 do not contact one another, adjacent electrodes 110 being spaced from one another. FIGS. 5 and 6 are 3-D representations of lens device 100.

Figure 9:
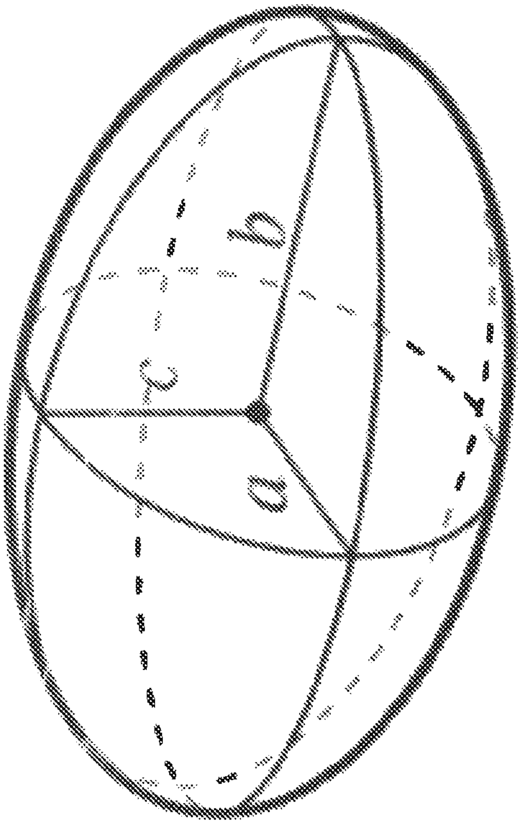
FIG. 9 is a perspective view of an ellipsoid depicting various parameters.

The shapes of the electrodes 110 and passageways 120 are selected to work in concert to merge the separate ion beams together into a single beam at the exit 122 of the lens device 100. In the embodiment depicted in FIG. 1, the electrodes 110 are ellipsoidal (in other words, they are elliptical in cross-section as depicted in FIG. 1) and form a 3-D structure with nested, similarly shaped, ellipsoids with spaces between each ellipsoid. The electrodes 110 form a stack of concentric and uniformly scaled ellipsoidal electrodes with a constant aspect ratio of $\sqrt{0.5}$ (in other words, approximately 0.707), for example, using the parameters depicted in FIG. 9 with (i) $a=c$ and (ii) $a/b=\sqrt{0.5}$, with the intersection between each ellipsoidal electrode and parabolic ion passageway being perpendicular (90 degrees). In this configuration the individual electrode plates are parallel to one another such that for a given reference point on a reference electrode plate, the reference point defines a reference surface normal vector that is normal (perpendicular) to the reference electrode plate at the reference point, a point on an adjacent electrode plate that is nearest to the reference point will have a surface normal vector that is parallel to the reference surface normal vector.

Each electrode 110 includes thirteen (13) passageways 120. When the plurality of electrodes 110 are positioned in relation to one another as depicted and described, the passageways 120 align to form thirteen (13) parabolic passageways through the electrodes 110. Five (5) passageways are depicted in the sectional views of FIGS. 1-3 and nine (9) passageways are depicted in FIGS. 5 and 6, the remaining passageways being similarly disposed around lens 100 are hidden due to the views chosen for the figures. The passageways 120 are circular in cross-section, although other embodiments include passageways 120 with different cross-sectional shapes, such as square and pentagonal. An ion beam can be directed to travel through each passageway 120. The number of electrodes 110 can be adjusted depending on the precision with which ion trajectories are to be controlled.

The ellipsoids depicted in FIGS. 1-6 have an aspect ratio of 0.707, which results in each electrode 110 being perpendicular to the parabolic ion trajectories as the ions pass each electrode. The thickness of the ellipsoidal electrodes 110 and spacing between two adjacent electrodes 110 can be adjusted to optimize the resultant merged beam 145, also referred to as a collimated beam, for the particular application at hand.

In at least one embodiment the lens device 100 is operated using two DC (direct current) voltages, one voltage being steadily applied to even numbered electrodes 110 and the other voltage being steadily applied to odd numbered electrodes 110, resulting in adjacent electrodes 110 being at different potentials. In some embodiments, one of the applied voltages is a "ground" voltage. In addition to embodiments where alternating electrodes have the same potential (for example, electrodes in a +−+− voltage configuration), other embodiments can have alternating groupings (for example, pairs) of electrodes at the same potential (for example, electrodes in a ++−−++−− configuration). In some embodiments, each ellipsoidal electrode is controlled individually with a particular DC voltage to optimize ion transmission and focusing, with some embodiments employing a unique potential on each electrode 110.

In some embodiments alternating DC voltages are applied to the electrodes 110 to confine the ion beams in the passageways 120, such as by applying an independent DC voltage to each electrode. One advantage of this approach is overall simplicity. The alternating DC voltages can take the form of, for example, square waves, sine waves or triangular waves.

In some embodiments radio frequency (RF) voltages are applied to confine the ion beams in the passageways 120. In some embodiments, a DC gradient is applied on top of the alternating DC voltage or the RF voltage. These embodiments will guide ions to move forward even when they have low kinetic energy.

By applying particular voltages to the electrodes 110, a well-defined electrical field for efficient ion transmission can be obtained.

A downstream lens may be used for further focusing and/or collimating the combined ion beam. One example downstream lens is an einzel lens 130 (see FIGS. 1-3), which can include three sections 132, 133 and 134 and define a central einzel lens axis. In at least one embodiment sections 132 and 134 are connected to the same DC power supply while section 133 is connected to a different DC power supply. Other types of downstream lenses include various direct current (DC), radio frequency (RF) and magnetic ion optics, such as multipole lenses (such as, quadrupole and hexapole lenses) and ion funnels. Mass analyzers and detectors can also be placed downstream of ion lens 100.

The multichannel lens 100 is typically constructed using a conductive material, such as stainless steel. While the aspect ratio of the ellipse formed by each electrode 110 can be varied depending on the specific implementation of each lens embodiment, an aspect ratio of approximately 0.707 is expected to produce optimal results. The angular displacement of each ion beam entering the lens from the central, horizontal axis of the device will typically be within the range 0 to 60 degrees)(0°-60°. Some embodiments include ion beams entering the lens at angular displacements higher than 60 degrees, and potentially as high as 90 degrees, although difficulties can arise when bending ion beams at these higher angular displacements. It can be seen in the 3-D shape of lens 100 depicted in FIGS. 5 and 6 that there are multiple passageways 120 displaced at the same angular displacement, such as multiple passageways 120 displaced 30 degrees (30°) from the central axis.

The features of the multichannel lens result in the initial velocity vectors of the multiple ion beams, and in particular those with kinetic energy of approximately 10 to 100 eV and a mass-to-charge ratio (m/z) of approximately 50 to 2,000, gradually changing and aligning along the instrument axis. Embodiments of this disclosure focus beams of ions with individual ion masses from 0.0005 to $1\times10^9$ Dalton, which include ion beams with constituent components from electrons to large biomolecules.

During operation, multiple ion beams (for example, ion beams 135, 136, 137, 138 and 139) enter the lens from different locations, entering their individual passageways through passageway entrance openings (for example, openings 140, 141, 142, 143 and 144, respectively), traveling along their individual parabolic trajectories, merging at the exit 122 of the multichannel lens 100 with the primary component of the ion velocity for each beam being directed along the horizontal instrument axis, and forming the merged ion beam 145. Ion beams also enter passageway entrance openings 146, 147, 148 and 149 and the four (4) openings that are not depicted in the figures. The merged ion beam is further focused by the downstream lens, for example einzel lens 130, and exit as indicated by an arrow. In at least one embodiment, the electrodes 110 are charged to specific voltages as described previously, typically in the range of 0 to 1,000 Volts DC, forming well-defined equipotential lines 150 as depicted in FIG. 4. As can be determined by the forgoing discussion, multiple approximately 1-100 eV molecular ion beams (m/z of 1 to 20,000, and in some embodiments an m/z of 200 to 2,000) can be merged into a single beam.

Embodiments include lenses 100 where the spacing between the electrodes 110, the shape of the passageways 120, and the width of the passageways 120 result in the central axis of each passageway 120 being perpendicular to each individual electrode 110 (or having an incident angle of at most 10 degrees (10°) from perpendicular to each individual electrode 110), which will result in the ion pathways being perpendicular to each individual electrode 110 (or having an indecent angle of at most 10 degrees (10°) from perpendicular to each individual electrode 110) as the ions travel down each passageway 120.

Lens 100 can focus ion beams with kinetic energy ranges (kinetic energy of the individual ions in the ion beams) from 0.1 to $1\times10^5$ eV. In operation, the lens 100 can be operated in a vacuum, which can minimize collisions with neutral molecules, facilitate operation of downstream devices (for example, quadrupole mass filters), and facilitate application of higher voltages to the electrodes 110. Operating lens 100 at lower pressures also increases the breakdown voltage (the voltage at which the region between the electrodes begins to conduct electricity) allowing application of higher voltages to electrodes 110. Some embodiments operate the lens 100 in substantial vacuum (for example, pressure less than less than 1 mTorr (<0.001 Torr)) to focus ion beams, while some embodiments operate the lens 100 in a high vacuum (for example, pressure less than less than 0.00001 Torr ($<1\times10^{-5}$ Torr)) to focus ion beams. At these low pressures individual ions in the beam(s) can have kinetic energy of approximately $10^3$ to $10^5$ eV.

In use, lens device 100 may be used as part of a mass spectrometry system, with embodiments of this present disclosure having use in both preparative and analytical mass spectrometry.

The example embodiment depicted in FIG. 1 includes 31 electrodes 110 with five (5) passageways 120. These five (5) passageways may be repeated in other dimensions out of the plane of the paper in FIG. 1. For example, embodiments with the same passageway configuration repeated in a plane perpendicular to the plane of the diagram in FIG. 1 results in an embodiment with a total of nine (9) passageways 120—one central passageway with eight (8) passageways 120 surrounding the central passageway 120, four (4) of the passageways 120 being a first distance from the central passageway and the remaining four (4) of the passageways 120 being at a second distance from the central passageway that is different from the first distance. Alternate embodiments include smaller and larger numbers of passageways 120 and smaller and larger number of electrodes 110.

A good balance in the number of passageways 120 is achieved in embodiments utilizing 13 passageways 120—one central passageway with 12 passageways 120 surrounding the central passageway, six (6) of the passageways 120 being a first distance from the central passageway (one every 60 degrees surrounding the central passageway) and the remaining six (6) of the passageways 120 being at a second distance from the central passageway that is different from the first distance (one every 60 degrees surrounding the central passageway, which may be at the same rotational locations as the first-distance set of passageways 120 or located rotationally between the first-distance set of passageways). See, FIG. 5 for a three-dimensional rendering of a 13 passageway embodiment with the first-distance and second-distance set of passageways 120 located at the same rotational locations.

Factors affecting the number of passageways include the space needed to position the ion beam generators around lens 100. Typical embodiments include from 2 to 65 passageways 120 located in the three dimensional space of the electrode stack, each with different orientations merging 2 to 65 ion beams, one ion beam in each passageway 120. Particular embodiments include from 5 to 32 passageways 120 located in the three dimensional space of the electrode stack with different orientations merging 5 to 32 ion beams, one ion beam in each passageway 120. Still further embodiments include 13 passageways 120 located in the three dimensional space of the electrode stack with different orientations merging 13 ion beams, one ion beam in each passageway 120.

The arrangement of passageways 120 can be varied depending on the number of ion beams being merged. For example, one or more passageways 120 can be located at a particular angular displacement from a central passageway, and one or more passageways can optionally be located at another angular displacement from a central passageway. In the example depicted in FIGS. 1 and 5, six (6) passageways 120 have entrances into lens 100 (namely passageway entrances 141, 143, 147, 148 and two additional passageways that are hidden from view in FIG. 5) at the same angular displacement (approximately 20 degrees as shown in FIG. 1) around a central passageway (namely central passageway 142), and six (6) more passageways 120 have entrances into lens 100 (namely passageway entrances 140, 144, 146, 149 and two additional passageways that are hidden from view in FIG. 5) at the same angular displacement (approximately 30 degrees as shown in FIG. 1) around a central passageway (namely central passageway 142). In other words, the six (6) passageways 120 with passageway entrances 141, 143, 147, 148 plus two additional passageways that are hidden from view in FIG. 5 are located on a ring (each passageway entrance spaced approximately 60 degrees from one another when viewing lens 100 from a position on the central axis of passageway 142) that is displaced at approximately 20 degrees (as shown in FIG. 1) around central passageway 142, and the six (6) passageways 120 with passageway entrances 140, 144, 146, 149 plus two additional passageways that are hidden from view in FIG. 5 are located on a ring (each passageway entrance spaced approximately 60 degrees from one another when viewing lens 100 from a position on the central axis of passageway 142) that is displaced at approximately 30 degrees (as shown in FIG. 1) around central passageway 142. Parameters of example embodiment configurations are included in Table 1.

TABLE 1

| Number of Rings where Passageway Entrances are Located | Number of Passageway Entrances on Each Ring | Angular Spacing between Adjacent Passageway Entrances | Total Passageways (including Central Passageway) |
|---|---|---|---|
| 1 | 1 | 360 degrees | 2 |
| 1 | 2 | 180 degrees | 3 |
| 1 | 4 | 90 degrees | 5 |
| 1 | 6 | 60 degrees | 7 |
| 2 | 4 | 90 degrees | 9 |
| 2 | 6 | 60 degrees | 13 |
| 2 | 8 | 45 degrees | 17 |
| 2 | 12 | 30 degrees | 25 |
| 3 | 4 | 90 degrees | 13 |
| 3 | 6 | 60 degrees | 19 |
| 3 | 8 | 45 degrees | 25 |
| 3 | 12 | 30 degrees | 37 |

Lens 100 can be sized for various applications. Embodiments of lens 100 are sized from 8 $cm^3$ (2×2×2 cm) to 8,000,000 $cm^3$ (200×200×200 cm). Further embodiments of lens 100 are sized from 1,000 $cm^3$ (10×10×10 cm) to 1,000,000 $cm^3$ (100×100×100 cm), and still further embodiments of lens 100 are sized at approximately 125,000 $cm^3$ (50×50×50 cm).

Embodiments of lens 100 are sized with lengths (item "b" in FIG. 9) from 2 to 200 centimeters (cm), total electrodes from 5 to 100, electrode thicknesses of 0.01 to 200 millimeters (mm), electrode thickness to electrode spacing ratios of 0.1 to 0.5, electrode spacing of 0.04 to 300 millimeters (mm), aperture diameters of 0.066 to 240 millimeters (mm), and aperture cross-sectional areas of 0.003 to 50,000 square millimeters ($mm^2$).

Further embodiments of lens 100 are sized with lengths (item "b" in FIG. 9) from 10 to 100 centimeters (cm), total electrodes from 20 to 40, electrode thicknesses of 0.1 to 20 millimeters (mm), electrode thickness to electrode spacing ratios of 0.1 to 0.5, electrode spacing of 0.8 to 30 millimeters (mm), aperture diameters of 0.83 to 30 millimeters (mm), and aperture cross-sectional areas of 0.5 to 700 square millimeters ($mm^2$).

The electrode thickness to aperture diameter ratio in many embodiments, including those described above, is between one-half (0.5) and two (2), and in certain embodiments the electrode thickness to aperture diameter ratio is approximately one (1). The cross-sectional area of the ellipsoid in many embodiments, including those described above, is approximately circular with items "a" and "b" in FIG. 9 approximately equal to one another.

Although passageways 120 are described as being parabolic in shape from the outer electrode 110 to the inner electrode 110, other embodiments include passageways that are defined by differently curved shapes, for example, hyperbolic, ellipsoidal, exponential (described by an exponential function), logarithmic (described by a logarithm function), trigonometric (described by a trigonometric function), semi-cubical parabolic, serpentine (described by a serpentine curve), trident (described by a trident curve), linear segments, or piecewise functions of these shapes.

Although electrodes 110 are described as being ellipsoidal in shape, other embodiments include electrodes that are described by differently curved shapes, for example, one of or a combination of the following three-dimensional (3-D) shapes: paraboloid, hyperboloid, exponential, logarithmic, trigonometric (trigonometric functions), semi-cubical paraboloids, serpentine (described by serpentine curves), trident (described by trident curves), piecewise curves (multiple pieces of curves positioned end-to-end), and piecewise linear curves (multiple straight lines positioned end-to-end). It should be understood that the 3-D shapes described using two-dimensional (2-D) terminology refer to 3-D shapes formed by revolution, sweep, extrusion or other means of using the 2-D shape to form a 3-D shape. The shapes are chosen or combined so that the ion passageways are perpendicular to each individual electrode or have a small incident angle of no more than ten (10) degrees, and no more than twenty (20) degrees in some embodiments.

Embodiments of lenses 100 may be manufactured by subtractive or additive machining.

Figure 7:
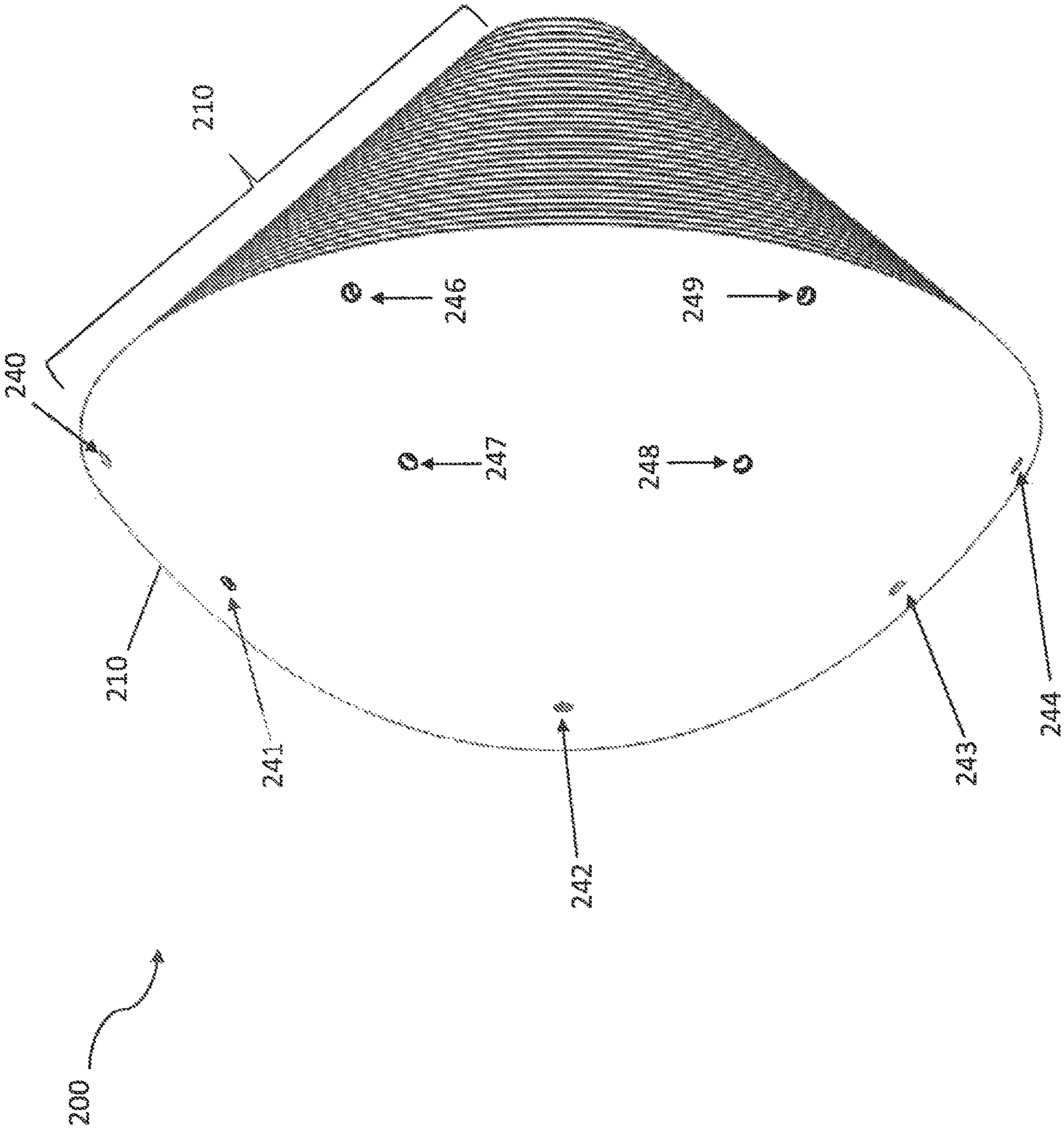
FIG. 7 is a perspective view of a front portion of a multi-channel ion beam lens according to another embodiment of the present disclosure.
Figure 8:
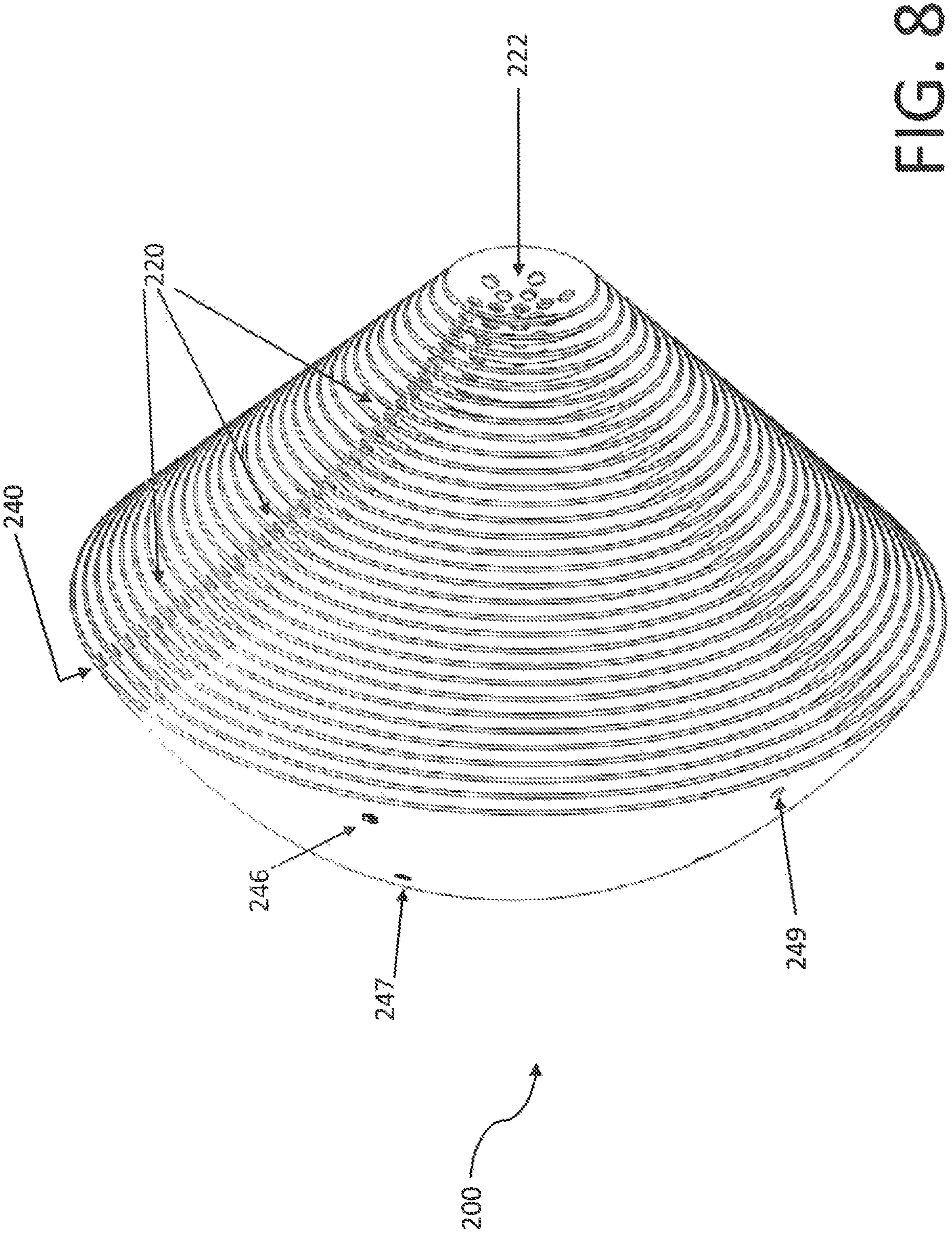
FIG. 8 is a perspective view of a rear portion of the ion beam lens depicted in FIG. 7.

Depicted in FIGS. 7 and 8 is a lens device 200 for merging multiple ion beams (for example, multiple hyperthermal ion beams) according to another embodiment of the present disclosure. The device shown in FIGS. 7 and 8 includes a plurality of electrodes 210 and a plurality of passageways 220 through the electrodes 210, the passageways 220 being defined by apertures in the electrodes 210. As can be seen by a comparison of FIGS. 7 and 8 to FIGS. 5 and 6, the embodiment depicted in FIGS. 7 and 8 is similar to the embodiment depicted in FIGS. 1-6 with the portions of the electrodes outside the outer passageways (for example, the passageways 220 with passageway openings 240, 244, 246, and 249) has been removed, reducing the overall size and weight of the lens. The shape and function of the features in lens 200 are similar to those of the similarly labeled features in lens 100 as described above. For example, the passageways 220 with passageway openings 240-244 and 246-249 channel ion beams to a common lens exit 222 in a similar fashion to how the passageways 120 with passageway openings 140-144 and 146-149 channel ion beams to a common lens exit 122. A downstream lens can also be positioned adjacent lens exit 222 to further collimate the ion beams exiting lens 200.

Embodiments of the ion lens can increase the total flux of ion beams generated from an ion source and produce ion beams with fluxes larger than the maximum flux achievable by an ion beam generator of a particular type. In at least some embodiments, the flux/current is improved by a factor equal to approximately the number of channels in the lens. For example, an ion lens focusing and merging 13 ion beams, each beam being generated from similar ion sources producing an ion beam with as high a flux as the source is capable, will produce a resultant ion beam with a total flux equal approximately 13 times the flux of a single ion beam. If using electrospray ion sources, each with a maximum flux of approximately 15 nA (nanoamperes), the lens can combine the ion beams from, for example, 13 electrospray ion sources and produce an ion beam with a total flux of approximately 0.5 μA (microamperes) to 1.0 μA (microamperes) by just using the ion lens.

While the embodiments illustrated in the figures depict electrodes 110 as being curved plates of unitary construction with apertures defining the passageways 120, other embodiments include electrodes 110 that are constructed of multiple components (such as electrodes constructed of smaller portions connected to one another that may, or may not, have gaps between the smaller portions) and electrodes 110 that may have additional apertures that are not used as ion beam passageways, such as perforated or mesh plates.

Elements depicted in FIGS. 7 and 8 with reference numerals similar to (for example, with two digits the same) those depicted in FIGS. 1-6 can function similar to (or the same as), be manufactured in a similar (or identical) manner, and have characteristics (and optional characteristics) similar to (or the same as) the elements in the other figures unless described as being incapable of having those functions or characteristics.

ELEMENT NUMBERING

The following is a list of element numbers and at least one noun used to describe that element. It is understood that none of the embodiments disclosed herein are limited to these descriptions, and these element numbers can further include other words that would be understood by a person of ordinary skill reading and reviewing this disclosure in its entirety.

| | |
|---|---|
| 100 | Device (Lens) |
| 110 | Electrode |
| 120 | Passageway |
| 122 | Lens Exit |
| 130 | Downstream Lens |
| 132 | Downstream Lens Section |
| 133 | Downstream Lens Section |
| 134 | Downstream Lens Section |
| 135 | Ion Beam |
| 136 | Ion Beam |
| 137 | Ion Beam |
| 138 | Ion Beam |
| 139 | Ion Beam |
| 140 | Passageway Entrance |
| 141 | Passageway Entrance |
| 142 | Passageway Entrance |
| 143 | Passageway Entrance |
| 144 | Passageway Entrance |
| 145 | Merged Ion Beams |
| 146 | Passageway Entrance |
| 147 | Passageway Entrance |
| 148 | Passageway Entrance |
| 149 | Passageway Entrance |
| 150 | Electric Field Line (line of equal electrical potential) |
| 200 | Device (Lens) |
| 210 | Electrode |
| 222 | Lens Exit |
| 240 | Passageway Entrance |
| 241 | Passageway Entrance |
| 242 | Passageway Entrance |
| 243 | Passageway Entrance |
| 244 | Passageway Entrance |
| 246 | Passageway Entrance |
| 247 | Passageway Entrance |
| 248 | Passageway Entrance |
| 249 | Passageway Entrance |

Reference systems that may be used herein can refer generally to various directions (for example, upper, lower, forward and rearward), which are merely offered to assist the reader in understanding the various embodiments of the disclosure and are not to be interpreted as limiting. Other reference systems may be used to describe various embodiments, such as referring to the direction of projectile movement as it exits the firearm as being up, down, rearward or any other direction.

While examples, one or more representative embodiments and specific forms of the disclosure have been illustrated and described in detail in the drawings and foregoing description, the same is to be considered as illustrative and not restrictive or limiting. The description of particular features in one embodiment does not imply that those particular features are necessarily limited to that one embodiment. Some or all of the features of one embodiment can be used in combination with some or all of the features of other embodiments as would be understood by one of ordinary skill in the art, whether or not explicitly described as such.

One or more exemplary embodiments have been shown and described, and all changes and modifications that come within the spirit of the disclosure are desired to be protected.

What is claimed is:

1. An apparatus, comprising:

a lens configured to merge two or more hyperthermal ion beams, the lens including first, second and third nested electrode plates connected to one another, the first, second and third nested electrode plates being curved and being arranged with the second nested electrode plate positioned between the first and third nested electrode plates, each of the first, second and third nested electrode plates defining a first aperture and a second aperture, each first aperture defining a first geometric center, and each second aperture defining a second geometric center;

wherein the first geometric centers of the first, second and third nested electrode plates define a first curved passageway extending through the first, second and third nested electrode plates, the second geometric centers of the first, second and third nested electrode plates define a second curved passageway extending through the first, second and third nested electrode plates; and wherein the second nested electrode plate is configured to connect to a first DC power source, the first and third nested electrode plates are electrically connected to one another and configured to connect to a second DC power source, the second nested electrode plate maintains a first DC voltage when connected to a first DC power source, and the third nested electrode plate maintains a second DC voltage that is different from the first DC voltage when the third nested electrode plate is connected to a second DC power source that has a different voltage from the first DC power source.

2. The apparatus of claim 1, wherein the at least three nested electrode plates are rotationally symmetric about a lens central axis.

3. The apparatus of claim 1, further comprising:

a fourth nested electrode plate, the fourth nested electrode plate being curved and positioned adjacent the third nested electrode plate, the third nested electrode plate being positioned between the second and fourth nested electrode plates, wherein the second and fourth nested electrode plates are electrically connected to one another and configured to connect to the first DC power source, and the second and fourth nested electrode plates maintain a first DC voltage when connected to the first DC power source.

4. The apparatus of claim 3, wherein the first, second, third and fourth nested electrode plates are ellipsoidal with an aspect ratio of 0.7.

5. The apparatus of claim 3, wherein the first and second passageways are parabolic.

6. The apparatus of claim 1, wherein the plurality of nested electrode plates are concentric and uniformly scaled ellipsoidal electrode plates, each ellipsoidal electrode plate defining an aspect ratio of $\sqrt{0.5}$.

7. The apparatus of claim 1, wherein the geometric centers of the first curved passageway define a first curved passageway central axis, and the first curved passageway central axis defines an incident angle in relation to any one nested electrode plate, and the incident angle is inclined no more than 10 degrees from perpendicular to the surface of each of the nested electrode plates.

8. The apparatus of claim 7, wherein the incident angle is perpendicular to each of the nested electrode plates.

9. The apparatus of claim 1, wherein the first, second and third nested electrode plates are rotationally symmetric about a lens central axis, the geometric centers of the first curved passageway define a first curved passageway central axis, the geometric centers of the second curved passageway define a second curved passageway central axis, and each of the curved passageways has an ion beam entrance and an ion beam exit, the ion beam exit being closer to the lens central axis than the ion beam entrance, the lens comprising:

a downstream lens defining a central downstream lens axis parallel to the lens central axis and positioned to receive ion beams exiting the ion beam exit of each of the curved passageways.

10. The apparatus of claim 1, wherein apertures in the first, second and third nested electrode plates define the curved passageways.

11. The apparatus of claim 10, wherein the apertures in the first, second and third nested electrode plates define a central passageway and at least three additional passageways positioned around the central passageway.

12. The apparatus of claim 1, wherein the lens is configured to merge ion beams with a majority of the ions in each of the ion beams having kinetic energies from one (1) to one hundred (100) electron volts (eV) and mass-to-charge ratios (m/z) from fifty (50) to two thousand (2,000).

* * * * *